United States Patent [19]

Parsons et al.

[11] Patent Number: 4,677,451
[45] Date of Patent: Jun. 30, 1987

[54] VERTICAL CHANNEL FIELD EFFECT TRANSISTOR

[75] Inventors: James D. Parsons, Newbury Park, Calif.; David E. Snyder, Seattle, Wash.

[73] Assignee: Hughes Aircraft Company, Los Angeles, Calif.

[21] Appl. No.: 737,613

[22] Filed: May 24, 1985

[51] Int. Cl.[4] .......................................... H01L 29/80
[52] U.S. Cl. ...................................... 357/22; 357/15; 357/55
[58] Field of Search ................... 357/22, 22 E, 23.4, 357/55, 15

[56] References Cited

U.S. PATENT DOCUMENTS 4,378,629 4/1983 Bozlee et al. .......................... 357/22
4,566,172 1/1986 Bencuya et al. .................. 357/22 E Primary Examiner—Martin H. Edlow
Attorney, Agent, or Firm—Terje Gudmestad; Wanda Denson-Low; A. W. Karambelas

[57] ABSTRACT

A semiconductor device component, and process for preparation thereof, wherein current flowing in a vertical channel of semiconductor material is controlled by metallic gates laterally disposed on either side of the channel. Insulator layers are positioned overlying and underlying each gate, to reduce parasitic capacitance which would otherwise be present if the metallic gate material were in contact with overlying and underlying semiconductor material. Reduction of the capacitance allows the use of wider gate strips, thereby reducing the series resistance to an external gate contact. These changes significantly improve the high-power, high-frequency performance of the device component, as compared with permeable base transistors.

13 Claims, 6 Drawing Figures

VERTICAL CHANNEL FIELD EFFECT TRANSISTOR

BACKGROUND OF THE INVENTION

This invention relates to semiconductor devices, and more particularly, to a field effect transistor.

Integrated circuit technology has developed a wide variety of devices having specialized characteristics, which may be fabricated on single chips with high packing densities. Among such specialized devices are permeable base transistors (PBT) for use in discrete and microwave integrated circuits. As set forth in U.S. Pat. No. 4,378,629, a permeable base transistor includes a single crystal semiconductor substrate forming a first emitter or collector, a Schottky-barrier metallic base layer overlying the substrate and having slits therethrough (so that the remaining metallic layer resembles "fingers" extending into the semiconductor material), and an epitaxial semiconductor single crystal filling the slits and overlying the base layer, thereby forming a second collector or emitter contact. In operation, when a voltage is applied between the emitter and collector contacts, current flow through the transistor is limited by application of a voltage to an external contact of the metal base layer.

The performance of permeable base transistors is limited by high internal capacitance and geometrical restrictions imposed to control such capacitance. More specifically, to prevent the depletion capacitance from seriously affecting performance, the lateral gate width (i.e., the width of each finger) must be kept less than the lateral channel width (i.e., the spacing between the fingers). The optimum channel width may be as small as about 0.08 micrometers, limiting the gate width to about this same value. A greatly decreased gate width may in turn result in reduced high speed device performance because of increased resistivity between the gate metal and its external contact. That is, the fine size of the "lead" to the gate metal may limit the rate at which the voltage in the gate may be varied.

Thus, while permeable base transistors offer significant promise as microwave transistors, this promise has not been realized because of internal parasitic capacitance and resistance problems. There has been proposed no approach for achieving improved performance, either with a newly conceived device or by improving upon existing permeable base transistor technology. Accordingly, there exists a need for obtaining improved high-frequency performance of a gated semiconductor device, while simultaneously allowing further size reduction so as to permit higher packing densisties of devices in chips. The present invention fulfills this need, and further provides related advantages.

SUMMARY OF THE INVENTION

The present invention provides a semiconductor device component, and a process for its fabrication, wherein current flow through semiconductor channels is limited by a voltage applied to a buried gate. Internal parasitic capacitance resulting from the interface of the gate with the surrounding semiconductor structure is reduced, directly improving metallic performance and allowing the gate width to be increased relative to the channel width. In turn, the increased gate width reduces the resistivity of the gate, so that both the internal parasitic capacitance and the gate resistance are reduced. High frequency performance of the device component is substantially improved, particularly when the device component is optimized in a manner to be described. Fabrication difficulties inherent in permeable base transistors are also reduced in some cases by using graphotaxy or masked epitaxial crystal growth. The resulting device component offers superior performance as a discrete microwave transistor, and allows the fabrication of high speed, low power integrated logic circuits.

In accordance with the invention, a semiconductor device component comprises a semiconductor single crystal first layer; a layered gate structure overlying the first layer, the gate structure including an insulator second layer overlying and in contact with the first layer, a metallic third layer overlying and in contact with the second layer, and having an external ohmic contact, an insulator fourth layer overlying and in contact with the third layer, this gate structure having a plurality of continuous channels vertically therethrough extending downwardly to the first layer; and a semiconductor fifth layer epitaxially deposited on the first layer and filling the channels, whereby a voltage applied to the ohmic contact controls the vertical current flow in the fifth layer.

In another aspect, a semiconductor device component comprises a semiconductor substrate, a column of semiconductor material extending upwardly from the substrate, the semiconductor material being epitaxially related to the substrate; a pair of layered gate structures extending upwardly from the semiconductor substrate, the gate structures contacting laterally opposing sides of the semiconductor column and each comprising a layer of insulator contacting the substrate, a metallic layer overlying the insulator layer contacting the substrate, and a layer of insulator overlying the metallic layer; and an external ohmic contact to each of the metallic layers. This embodiment of the invention may be viewed as a single element of the multielement device described previously, and can be extended to include a plurality of upwardly extending semiconductor channels or columns having a selected prismatic geometry, so that the channels are separated by "fingers" of the gate structure. Optionally, an n+ doped overlayer may be deposited epitaxially upon the top of the gate structures and the column.

The device component of the present invention is compatible with all known semiconductor technologies, but gallium arsenide and III–V compound technologies are preferred. Using gallium arsenide-based technology, the preferred semiconductor material is n-type gallium arsenide, the insulator is silicon dioxide or silicon nitride, and the metallic gate is any appropriate metal such as tungsten, aluminum or molybdenum.

Specific design parameters for geometric relationships in preferred embodiments of the device component are set forth subsequently, and summarized in the design rules of equations 1–3.

A process for fabricating a preferred embodiment of the semiconductor device component comprises the steps of furnishing a semiconductor single crystal first layer; forming successively upon and overlying the first layer an insulator second layer, a metallic third layer, and an insulator fourth layer; removing material from the second, third and fourth layers to form a continuous vertical channel therethrough, extending downwardly to expose an area of the first layer; and depositing epitaxially, on the exposed area of the first layer, a semiconductor fifth layer extending upwardly in the channel formed in the step of removing. This process is performed utilizing procedures appropriate to the semiconductor technology chosen, but typically involves process steps such as crystal growth, epitaxial deposition, graphotaxy, masking and photolithography. The fabrication procedure is fully compatible with existing integrated circuit technologies, and allows the integration of the semiconductor device of the invention with other devices in large scale arrays on chips. All necessary device fabrication technologies have been demonstrated for gallium arsenide-based devices.

It will now be appreciated that the semiconductor device and process of the present invention present important advances in the field of semiconductor technology. Vertical channel field effect transistors may be fabricated as discrete devices or as a part of integrated circuits utilizing advanced, but well documented, technology. The devices themselves allow the control of current flowing through the channels by application of a voltage to a gate contact. The insulator layers lying above and below the metallic gates reduce the parasitic capacitances on the broad faces of the gates, directly improving the high frequency performance of the device. Reduction of parasitic capacitance associated with the broad face allows the gates themselves to be made laterally wider than was previously possible, and specifically wider than the channel widths, to reduce the resistivity of the gates, further improving high frequency performance. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

Figure 1:
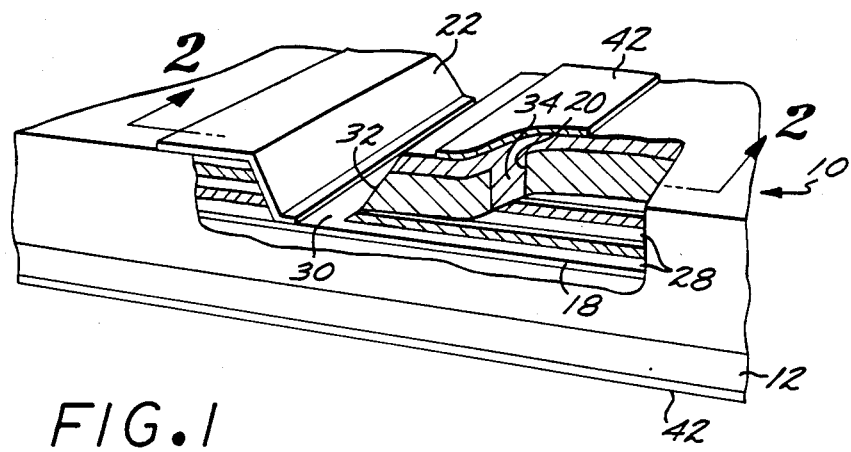
FIG. 1 is a perspective view of a semiconductor device component with portions broken away to illustrate the layered structure.
Figure 2:
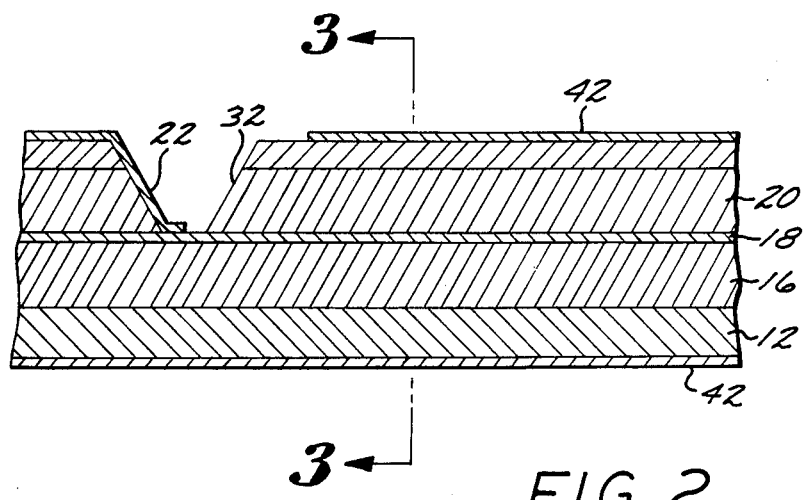
FIG. 2 is an enlarged side sectional view of the component of FIG. 1, taken generally along line 2—2.
Figure 3:
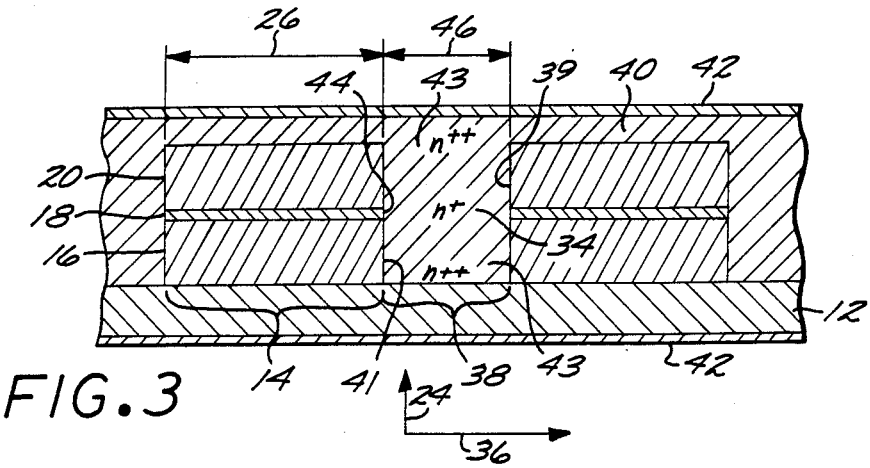
FIG. 3 is an enlarged end sectional view of the component of FIG. 2, taken generally along line 3—3.
Figure 4:
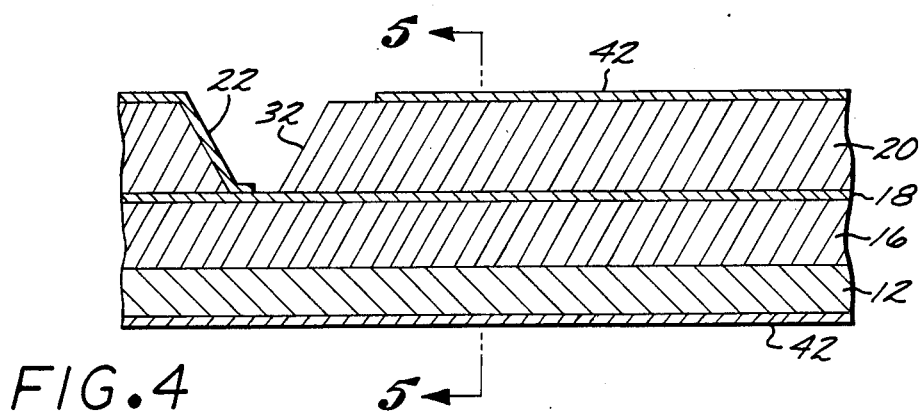
FIG. 4 is an enlarged side sectional view of another embodiment of the invention, in a view similar to that of FIG. 2.
Figure 5:
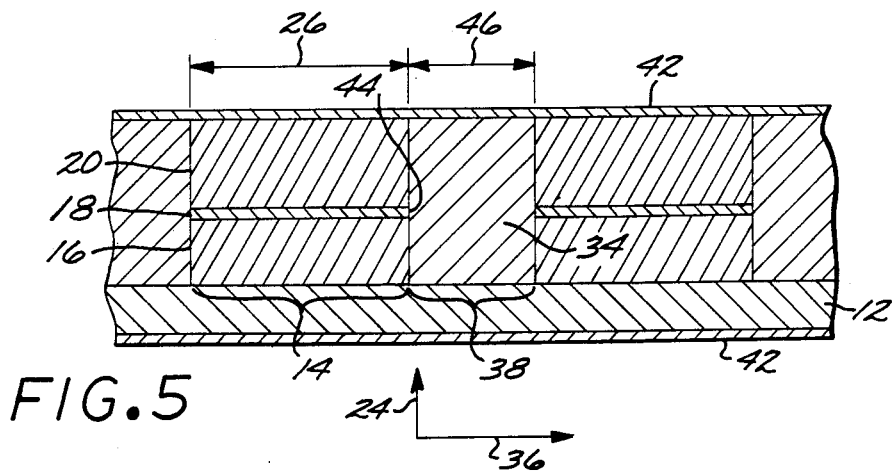
FIG. 5 is an enlarged end sectional view of the component of FIG. 4, taken generally along line 5—5.

As illustrated in FIGS. 1-3 for a first preferred embodiment, and FIGS. 4-5 for a second preferred embodiment, the present invention is embodied in a semiconductor device component which may be fabricated as a discrete device or as part of an integrated circuit. Referring to the embodiment of FIGS. 1-3, the device component, indicated generally by the numeral 10, is fabricated on a substrate comprising a semiconductor single crystal first layer 12. The first layer 12 is typically a chip of semiconductor material doped n+ and having a thickness up to about 0.25 millimeters. The lateral size of the chip may be selected as required to accept the discrete device or integrated circuit to be fabricated thereupon.

A layered gate structure 14 overlies the first layer 12, the gate structure 14 generally being a column extending upwardly from the substrate first layer 12. The gate structure 14 includes three layers. An insulator second layer 16 overlies the contacts the upper surface of the semiconductor first layer 12. A metallic third layer 18 overlies and contacts the upper surface of the insulator second layer 16. An externaly accessible base contact 22 provides an external electrical connection to the metallic third layer 18, so that a voltage may be applied to the third layer 18 by an external voltage source (not shown). An insulator fourth layer 20 overlies and contacts the upper surface of the metallic third layer 18.

As illustrated in FIG. 1, in the presently preferred embodiment the metallic third layers 18 are elongated in one horizontal direction (left-to-right in FIG. 2), to form relatively flat, elongated platelets, conveniently referred to as "fingers" 28. The fingers 28 are disposed parallel to each other and are spaced apart in a lateral direction 36, as shown in FIG. 3. The width of the fingers in a lateral direction 36 is termed a gate width 26, and the spacing between the fingers in the lateral direction 36 is termed a channel width 46. The fingers 28 become gates for controlling current flowing in a vertical direction 25 in a vertical channel 38 lying between the fingers 28. In the illustrated embodiment, the fingers 28 (i.e. the third layers 18) are conveniently joined together at one end by a common contact 30, which in turn is electrically continuous with the base contact 22. Electrical contact to the fingers 28 and the common contact 30 is made by extending the base contact 22 into a depression 32 in the device component 10, which depression 32 is deep enough to allow access to the common contact 30. Alternatively, each finger 28 may be separately and individually contacted to an external voltage source (not shown), as where the device component 10 is used in a logic array.

In this embodiment, the gate structure 14 amounts to two vertical metal-insulator-semiconductor arrays, oriented back-to-back with a common metal portion, the metallic third layer 18. This system replaces the metal-semiconductor Schottky barriers found in conventional permeable based transistors such as disclosed in U.S. Pat. No. 4,378,629. The capacitance of the gate structure 14 in the direction perpendicular to the broad face of the first layer 12, herein termed the vertical direction 24, is a series combination of the capacitance of the insulator layers 16 and 20, preferably an oxide, and the space-charge capacitance of the semiconductor material contacting the insulator layers 16 and 20. The metal-insulator capacitance is the largest capacitance of the system, and may be made arbitrarily small by increasing the thicknesses of the second layer 16 and the fourth layer 20.

By contrast, the capacitance associated with the Schottky barriers of the metal-semiconductor interface of permeable base transistors may not be readily varied except by changing the lateral area of the metallic third layer 18, thereby imposing a severe design constraint on the permeable base transistor. Replacement of the narrow depletion region of the metal-semiconductor interface of a permeable base transistor with the thicker oxide layers of lower dielectric constant significantly reduces the gate contact parasitic capacitance of the device component 10, as compared with that of a permeable base transistor. Reduced parasitic capacitance per unit interface surface area of the gate structure allows the gate width 26 of the gate structure 14 to be increased. A larger gate width increases the cross-sectional conducting area of the third layer 18, thereby reducing the series resistance from the base contact 22 to points within the third layer 18.

Lying between the fingers 28, and thence between the adjacent gate structures 14, is a semiconductor fifth layer 34. The lateral sides of the gate structures 14 and the fingers 28, lying normal to the lateral direction 36, defined the vertical channel 38 extending upwardly from the semiconductor substrate first layer 12. The semiconductor fifth layer 34 fills the vertical channel 38 so defined, and is contacted on its laterally opposed sides by laterally adjacent gate structures 14. More specifically, the semiconductor fifth layer 34 is contacted on its laterally opposing sides by the adjacent, laterally separated fingers 28 contained therein, so that the fingers 28 can act as gates for limiting vertical current flow in the semiconductor material lying in the vertical channels 38.

The semiconductor fifth layer 34 is epitaxially related to the semiconductor substrate first layer 12, and may be of the same composition, crystal orientation, defect structure, and electrical characteristics. Thus, while the first layer 12 and the fifth layer 34 are illustrated as different elements in the figures, in reality these two layers form a single, physically contiguous crystal in which the gate structure 14 is buried. alternatively, and as illustrated in fIG. 3, the semiconductor material in the fifth layer 34 may also be more heavily doped n++ adjacent an upper side surface 39 of the insulator layer 20 and a lower side surface 41 of the insulator layer 16, remote from the metallic third layer 18, in areas indicated by the numeral 43. The heavier n++ doping provides excess charge carriers to lower the resistivity and raise the conductivity of these regions, thereby improving the high frequency performance of the device. Care is taken so that the heavier doping does not extend to the central portion of the vertical channel 38 laterally adjacent the metallic third layer 18, which would interfere with the current-limiting function of the device.

In the first preferred embodiment of FIGS. 1-3, the fifth layer 34 is extended vertically upwardly to a height greater than that of the gate structure 14, and laterally to form a semiconductor gate overlay 40. As used herein, the semiconductor gate overlay 40 is part of the semiconductor fifth layer 34. In the second preferred embodiment illustrated in FIGS. 4-5, the height of the semiconductor fifth layer 34 in the vertical direction is the same as that of the gate structure 14, so that no semiconductor overlay 40 is present. Nonetheless, the adjacent portions of the semiconductor fifth layer 34 separated by gate structures 14 may remain continuous beyond the tips of the fingers 28, if desired. The different channels 38 could also be isolated from each other, as where logical arrays are formed containing the channels. Such various arrangements of the semiconductor fifth layer 34 are within the scope of the present invention.

Semiconductor contacts 42 are positioned on the vertically opposing faces of the device component 10, to provide external electrical contact to the semiconductor material of the first layer 12 and the fifth layer 34. The opposing contacts 42 act as source and drain contacts for the device. When an electrical potential is applied between the semiconductor contacts 42, an electrical driving force for current flow through the vertical channels 38 is created. Under the influence of this driving force, an electrical current flows in the vertical direction 24, unless otherwise limited.

The current may be limited by applying a voltage to the base contact 22, and thence to the third layers 18 (fingers 28), which creates a potential field extending inwardly into the semiconductor material of the fifth layers 34 of the vertical channels 38, adjacent a Schottky barrier gate source 44 portion of the third layer 18. The internal electrical potential thereby generated in the semiconductor material of the vertical channels 38 limits the width of the conducting volume and thence the current flow in the vertical direction through the vertical channels 38, in the manner described in U.S. Pat. No. 4,378,629. By contrast with the permeable base transistor of that patent, the presence of the insulator second and fourth layers 16 and 20 reduces the parasitic capacitance of the device component 10, thereby improving the performance of the device component 10, particularly at high frequencies.

While the design of the device component 10 inherently attains improved performance over the conventional permeable base transistor, its performance may be optimized by adhering to design rules relating the material characteristics and geometrical parameters of the device component. The first design rule sets forth the relationship between the channel width 46 of the vertical channel 38 and the doping density of the semiconductor material of the fifth layer 34 lying within the channel 38. For an n-channel device component 10, the device should begin conducting current between the source and drain contacts 42 when a gate-source potential greater than a threshold $V_t$ is applied. This condition is met when the Schottky barrier depletion region between the metallic third layer 18 and the semiconductor fifth layer 34 extends just across the channel width 46. Any greater voltage applied to the gate 18 uncovers an ohmic conducting path between the semiconductor contacts 42. This condition is met when:

$$\frac{W_c}{2} = \sqrt{\frac{2\epsilon_s(\phi - V_t)}{qN_{ch}}} \quad (1)$$

$W_c$ is the channel width 46, $\epsilon_s$ is the semiconductor permitivity, $\phi$ is the Schottky barrier height, q is the magnitude of the electron charge, and $N_{ch}$ is the channel semiconductor doping density. As equation 1 demonstrates, it is desirable to have flexibility in fixing the channel width 46 to optimize electrical performance of the device component 10, without the necessity of simultaneously fixing the gate width 26. The reduction of parasitic capacitances in the present device allows the gate width 26 to be fixed arbitrarily and independently of the channel width 46, and in particular the gate width 26 may be set to a value greater than the channel width 46.

The second design rule defines the preferred minimum thickness of the insulator layers 16 and 20, above and below the metallic third layer 18 which forms the gate of the device component 10. To achieve performance superior to that of conventional permeable base transistors, the capacitance of the device component 10 must be less than the corresponding capacitance due to the Schottky barrier on the broad face of the metallic third layer 18 normal to the vertical direction 24. This condition is met when $$t \geq \epsilon_{ox} \sqrt{\frac{2\phi}{qN_{ch}\epsilon_s}} \quad (2)$$

t is the insulator thickness in the direction parallel to the vertical direction 24, and $\epsilon_{ox}$ is the oxide permitivity. Improved performance may be attained by making the insulator layers 16 and 20 thicker than this preferred minimum value. For example, if the insulator layers 16 and 20 are each made n times the thickness of this preferred minimum value, the gate width 26 may be increased by a factor of n, resulting in a 1/n reduction in gate resistance. Thus, from the viewpoint of device performance, thicker insulator layers, possibly extending vertically the entire distance to the semiconductor contacts 42, reduce the gate contact parasitic capacitance. If the n+ contact regions are doped at a sufficiently high level, increasing the oxide thickness creates no difficulties with excessive source and drain resistance.

The third design rule defines a preferred minimum dimension for each of the spacings between the gate metallic third layer 18 and the n+-contact regions, the source and drain semiconductor contacts 42. Since most of the voltage drop between the semiconductor contacts 42 occurs in the n-channel semiconductor between the n+-contact and the gate layer 18, this dimension must be sufficiently large to prevent electric field magnitudes in excess of the avalanche ionization field from forming. This design requirement is satisfied when $$L_D, L_s \geq V_{max}/E_A \quad (3)$$

$L_s$ is the gate to n+-source spacing, $L_D$ is the gate to n+-drain spacing, $V_{max}$ is the maximum drain-source voltage, and $E_A$ is the semiconductor avalanche ionization electric field.

As noted previously, the three design rules provide design guidance for the most preferred embodiments of the invention. The most preferred embodiments achieve performance superior to that of the conventional permeable base transistor, but satisfaction of the design rules is not a prerequisite to operability of the device component 10.

Figure 6:
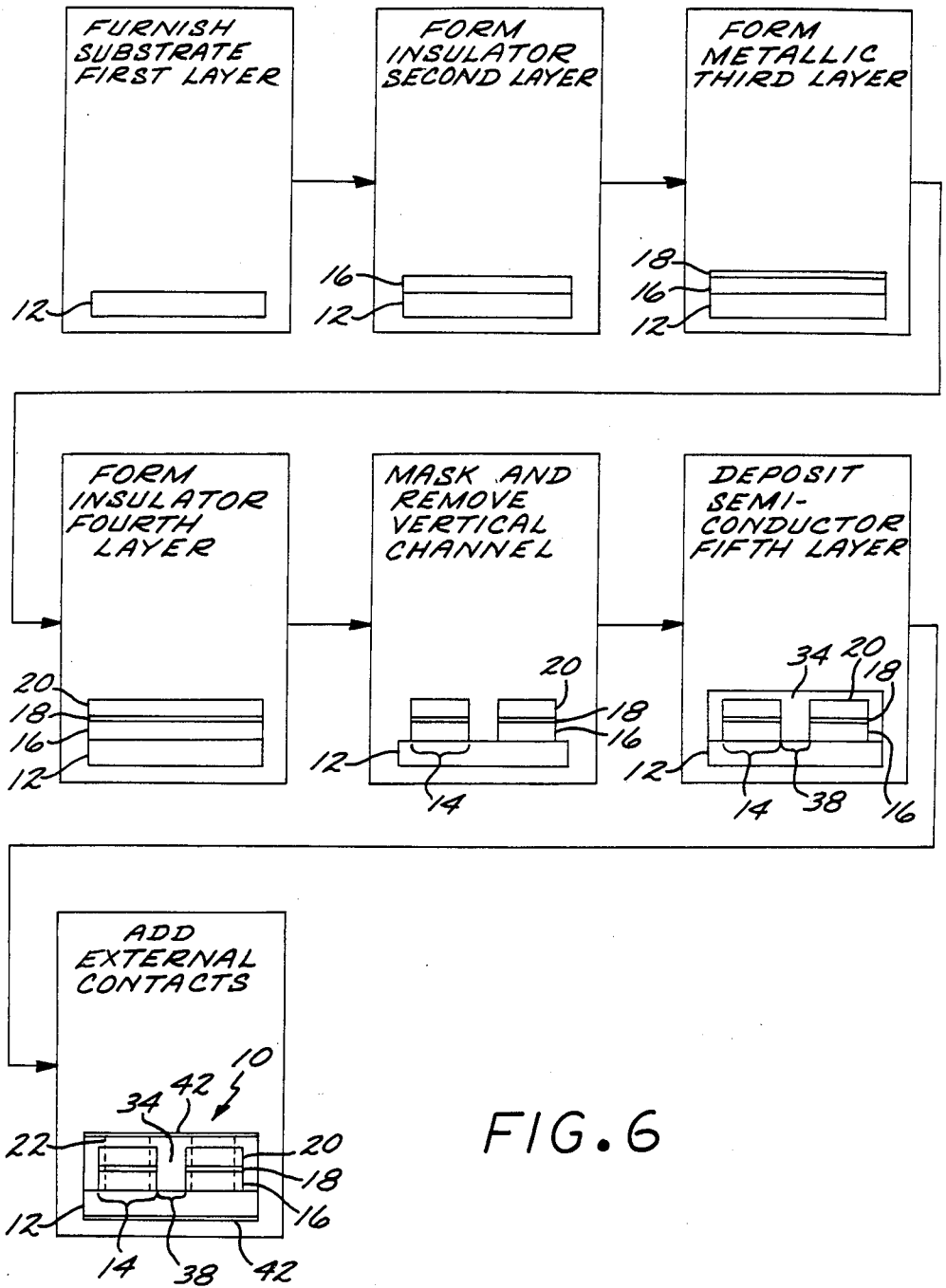
FIG. 6 is a process block diagram for fabricating the device component illustrated in FIGS. 2 and 3, with the structure resulting from each step illustrated in the view of FIG. 3.

FIG. 6 illustrates in block diagram form a preferred process for fabricating a semiconductor device component 10 in accordance with the invention. The substrate semiconductor first layer 12 may be furnished by growing a semiconductor single crystal of the appropriate thickness and size. Such crystals for use in fabricating intergrated circuits are typically about 0.25 millimeters thick and sufficiently large in lateral extent to accommodate the necessary devices. The insulator second layer 16 is then deposited to overlie the first layer 12, the metallic third layer 18 is deposited to overlie the second layer 16, and the insulator fourth layer 20 is deposited to overlie the metallic third layer 18. The precise parameters of the deposition techniques will be determined by the insulator and metal chosen, but such processes are well known to those skilled in the art.

The gate structures 14 are formed by masking a pattern on the upper surface of the fourth layer 20, and then removing the unmasked material, again by techniques well known in the art. Typically, a mask is deposited having the shape of the fingers 28 and the contact 30, on the upper surface of the fourth layer 20. The unmasked material is then removed by a suitable technique such as chemical or other etching. The removal of material results in the continuous vertical channel 38 downwardly through the layers 16, 18 and 20, to expose areas on the upper surface of the first layer 12.

The semiconductor fifth layer is next epitaxially deposited onto the exposed upper surface of the first layer 12. Deposition is by any suitable technique for depositing a doped semiconductor, preferably of the same general composition as the substrate first layer 12. The vertical height of the fifth layer 34 may be limited to the same thickness as that of the gate structure 14, resulting in a device of the type pictured in FIG. 5. Alternatively, the height of the fifth layer 34 may be made greater than that of the gate structure 14, to produce a device of the type pictured in FIG. 3. In the preferred gallium-arsenide based device, if the gate width 25 is established at less than about 20 micrometers, and the insulator 20 is silicon dioxide, no deposition and growth of n+ doped gallium arsenide occurs on the exposed top face of the fourth layer 20 until the portion of the vertical channel 38 lying between the gate structures 14 is filled. This phenomenon is known as graphotaxy. After the vertical channel 38 is filled, the semiconductor fifth layer 34 extends further vertically and laterally by single crystal growth. FIG. 6 specifically illustrates the preferred procedure for fabricating the device illustrated in FIG. 3.

Finally, and optionally, external ohmic contacts are added to complete the device component 10. The semiconductor contact 42 is deposited onto the lower surface of the first layer 12. The semiconductor contact 42 is also deposited onto the upper surface of the fifth layer 34 (in the embodiment of FIG. 3) or the upper surface of the fifth layer 34 and the upper surface of the gate structure 14 (in the embodiment of FIG. 5). The base contact 22 is provided by etching or otherwise forming the depression 32 into the upper surface of the device component 10, of sufficient depth to expose the metallic third layer 18, and the common contact 30, if provided. An ohmic contact material is then deposited over the exposed area to provide an electrical contact to the third layer 18 along the upper surface of the device component 10. Other means may be used to provide the necessary electrical contacts, in specific device structures.

The device component 10 of the present invention is preferably fabricated utilizing gallium arsenide-based or other III-V compound and alloy semiconductor technologies. In gallium arsenide-based technologies, the first layer 12 and fifth layer 34 are preferably n+ doped gallium arsenide, the insulator second layer 16 and insulator fourth layer 20 are preferably silicon dioxide or silicon nitride, the metallic gate third layer 18 is any metal such as tungsten, aluminum, molybdenum, zirconium, osmium, iridium, or ruthenium, and the ohmic contacts 42 are any suitable conducting material such as those just listed. In III-V based technology, the first layer 12 and fifth layer 34 are preferably n+ doped III-V compounds and alloys, the insulator second layer 16 and insulator fourth layer 20 are preferably silicon dioxide or silicon nitride and the metallic third layer and external contacts are any suitable metal such as those set forth above.

A variety of complex devices may be fabricated from the basic device component 10. Such a device component minimally requires a single vertical channel 38 of semiconductor fifth layer 34 material, laterally bounded by a pair of gate structures 14 contacting the laterally oppositely disposed sides of the vertical channel 38. Additional fingers 28 of the gate structure 14 may be added in parallel extending laterally, in the manner illustrated in FIG. 1. More complex patterns of the gate structure 14 and the fingers 28 may be formed for specific devices, as, for example, illustrated in U.S. Pat. No. 4,378,629, whose disclosure is herein incorporated by reference. That is, the device component 10 may be substituted for conventional permeable base transistors in many specific devices, to achieve improved operating characteristics.

It will now be appreciated that, through the use of this invention, there is provided a vertical channel field effect transistor having improved high frequency performance, which is particularly suited as a microwave transistor or a high speed, low power integrated logic circuit element. By introducing insulator layers into the gate structure above and below the metallic gate, parasitic capacitances are reduced and the gate width may be increased, both results contributing to improved high frequency performance. Although particular embodiments of the invention have been described in detail for purposes of illustration, various modifications may be made without departing from the spirit and scope of the invention. Accordingly, the invention is not to be limited except as by the appended claims.

What is claimed is:

1. A semiconductor device component, comprising:
   a semiconductor single crystal first layer;
   a layered gate structure overlying said first layer, said gate structure including
      an insulator second layer overlying and in contact with said first layer,
      a metallic third layer overlying and in contact with said second layer, and having an external ohmic contact,
      an insulator fourth layer overlying and in contact with said third layer,
      said gate structure having a plurality of continuous grooves extending vertically therethrough to said first layer, said grooves dividing said metallic third layer into a plurality of fingers spaced apart by the width of said grooves; and
   a semiconductor fifth layer of a single conductivity type epitaxially deposited on said first layer and filling said grooves, and contacting laterally opposing walls of said grooves including contacting directly the lateral edges of said fingers to establish a vertical channel of semiconductor material for the conduction of carriers, whereby a voltage applied to said ohmic contact controls the vertical current flow in a fifth layer.

2. The component of claim 1, wherein the semiconductor material in said vertical grooves is more heavily doped remote from said metallic third layer than adjacent said third layer along the vertical extent of said grooves.

3. The component of claim 1, wherein said first layer and said fifth layer are doped III-V semiconductor compounds.

4. The component of claim 1, wherein said first layer and said fifth layer are doped gallium arsenide.

5. The component of claim 1, wherein said second layer and said fourth layer are selected from the group consisting of silicon nitride and silicon dioxide.

6. The component of claim 1, wherein the grooves are substantially in the shape of rectangular prisms, are parallel to each other, and are laterally separated by a predetermined dimension.

7. The component of claim 1, wherein said predetermined dimension is less than about 20 micrometers.

8. The component of claim 1, wherein the vertical thickness of sid fifth layer is greater than the sum of the thickness of said second, third and fourth layers, and said fifth layer extends over the top of said fourth layer.

9. A semiconductor device component, comprising:
   a semiconductor substrate;
   a column of semiconductor material of a single conductivity type extending upwardly from said substrate, the semiconductor material being epitaxially related to said substrate;
   a pair of layered gate structures extending upwardly from said semiconductor substrate, said gate structures contacting laterally opposing sides of said semiconductor column and each comprising a first layer of insulator contacting said substrate, a metallic layer overlying said first insulator layer, an edge of said metallic layer directly contacting said semiconductor column, and a second layer of insulator overlying said metallic layer; and
   an externally ohmic contact to each of said metallic layers.

10. The component of claim 9, wherein the semiconductor material in said columns is more heavily doped remote from said metallic layer than adjacent said metallic layer.

11. The component of claim 9, wherein said column and said substrate are doped III-V semiconductor compounds.

12. The component of claim 9, wherein said column and said substrate are doped gallium arsenide.

13. The component of claim 9, wherein said insulator layers are selected from the group consisting of silicon nitride and silicon dioxide.

* * * * *